United States Patent
Hwu

(10) Patent No.: US 11,689,227 B1
(45) Date of Patent: Jun. 27, 2023

(54) BROADBAND POWER AMPLIFIER DEVICE AND TRANSMITTER

(71) Applicant: HANGZHOU GEO-CHIP TECHNOLOGY CO., LTD., Hangzhou (CN)

(72) Inventor: Sy-Chyuan Hwu, Hangzhou (CN)

(73) Assignee: HANGZHOU GEO-CHIP TECHNOLOGY CO., LTD., Hangzhou (CN)

(*) Notice: Subject to any disclaimer, the term of this patent is extended or adjusted under 35 U.S.C. 154(b) by 47 days.

(21) Appl. No.: 17/541,638

(22) Filed: Dec. 3, 2021

(51) Int. Cl.
  *H04B 1/04* (2006.01)
  *H03F 1/24* (2006.01)
  *H03F 1/56* (2006.01)
  *H03F 3/24* (2006.01)

(52) U.S. Cl.
  CPC ........... *H04B 1/04* (2013.01); *H03F 1/565* (2013.01); *H03F 3/245* (2013.01); *H03F 2200/222* (2013.01); *H03F 2200/387* (2013.01); *H03F 2200/451* (2013.01)

(58) Field of Classification Search
  None
  See application file for complete search history.

(56) References Cited

U.S. PATENT DOCUMENTS

| | | | | |
|---|---|---|---|---|
| 9,960,795 B1* | 5/2018 | Liu | ........................... | H03F 3/245 |
| 10,305,428 B1* | 5/2019 | Yang | ..................... | H03D 7/1458 |
| 2003/0064698 A1* | 4/2003 | Kim | ...................... | H03D 7/1441 |
| | | | | 455/313 |
| 2011/0115565 A1* | 5/2011 | Cabanillas | ................ | H03F 3/72 |
| | | | | 330/307 |
| 2011/0279184 A1* | 11/2011 | Chan | ....................... | H03F 3/195 |
| | | | | 330/277 |
| 2013/0190036 A1* | 7/2013 | Zhao | ..................... | H03F 1/0277 |
| | | | | 455/550.1 |
| 2016/0380592 A1* | 12/2016 | Rajendran | ............ | H03D 7/1483 |
| | | | | 455/118 |
| 2021/0119671 A1* | 4/2021 | Jung | .................... | H04B 5/0037 |
| 2021/0258023 A1* | 8/2021 | Lyn | .......................... | H03D 7/14 |
| 2022/0376733 A1* | 11/2022 | Datta | .................... | H03F 3/3083 |
| 2023/0034531 A1* | 2/2023 | Luo | ......................... | H03F 1/565 |

* cited by examiner

*Primary Examiner* — Pablo N Tran
(74) *Attorney, Agent, or Firm* — Nixon & Vanderhye P.C.

(57) ABSTRACT

A broadband power amplifier device includes an input matching network including first, second and third inductors, a driver amplifier, and first, second and third frequency modulators. First inductor has one end connected to output of a mixer and the other end connected to one end of the first frequency modulator, with the other end of the first frequency modulator being grounded. The second inductor has one end connected to one end of first inductor and the other end connected to input of driver amplifier, with second frequency modulator being connected across second inductor. Third inductor has one end connected to output of driver amplifier and the other end connected to input of power amplifier, with third frequency modulator being connected across third inductor. Bandwidth of power amplifier device can be extended and area and current consumption thereof can be reduced, while power can be improved without large LO driver.

4 Claims, 4 Drawing Sheets

BROADBAND POWER AMPLIFIER DEVICE AND TRANSMITTER

TECHNICAL FIELD

The present disclosure relates to the field of wireless communication technologies, in particular to a broadband power amplifier device and a transmitter.

BACKGROUND

A conventional transmitter (TX) chain for transmitting radio frequency (RF) signals includes a digital baseband unit, a digital-to-analog converter (DAC), a low-pass filter (LPF), a mixer, an input matching network (MN), a power amplifier (PA), an output matching network (MN) and an antenna which are connected in sequence. Conventionally, the input matching network and the output matching network are each composed of shunt inductors and provide a gain only in a range of resonance frequencies. In addition, the shunt inductor loses the signal gain at low frequencies thus the operable RF range of the transmitter is limited as being rather narrow. Moreover, the existing methods for extending the RF range of conventional transmitters increase the hardware area, power consumption and current consumption of the transmitters, and degrade the power efficiency of the transmitters.

SUMMARY

The present disclosure provides a broadband power amplifier device and a transmitter to solve one or more technical problems in the prior art.

In a first aspect, embodiments of the present disclosure provide a broadband power amplifier device which is applicable to a transmitter and has an input terminal connected to a mixer and an output terminal connected to an antenna. The broadband power amplifier device includes an input matching network, a power amplifier, and an output matching network connected in sequence, where the input matching network includes a first inductor, a second inductor, a third inductor, a driver amplifier, a first frequency modulator, a second frequency modulator, and a third frequency modulator. The first inductor has a first end connected to an output terminal of the mixer and a second end connected to one end of the first frequency modulator, with the other end of the first frequency modulator being grounded. The second inductor has a first end connected to the first end of the first inductor and a second end connected to an input terminal of the driver amplifier, with the second frequency modulator being connected across the second inductor. The third inductor has a first end connected to an output terminal of the driver amplifier and a second end connected to an input terminal of the power amplifier, with the third frequency modulator being connected across the third inductor.

In certain embodiments, the first frequency modulator, the second frequency modulator and the third frequency modulator are all tunable capacitors.

In certain embodiments, the broadband power amplifier device is operable in a radio frequency range greater than 6 GHz.

In a second aspect, embodiments of the present disclosure provide a transmitter including the aforesaid broadband power amplifier device.

The technical solution of the present disclosure is advantageous in that, with the introduction of a plurality of inductors connected in series into the broadband power amplifier device, the effect of parasitic capacitance can be cancelled through resonation, and the operatable radio frequency range (i.e. with the same gain) of the power amplifier can begin from 0 Hz, which can effectively extend the operable bandwidth of the power amplifier device, while reducing the area and current consumption of the power amplifier device and increasing the power of the power amplifier device greatly without a large Local Oscillator (LO) driver.

The above summary is only for the purpose of description and is not intended to limit the present disclosure in any way. In addition to the illustrative aspects, embodiments, and features described above, further aspects, embodiments, and features of the present disclosure will become apparent by referring to the accompanying drawings and the following detailed description.

BRIEF DESCRIPTION OF THE DRAWINGS

In the drawings, unless otherwise specified, the same reference signs refer to the same or similar components or elements throughout the drawings, and the drawings are not necessarily drawn to scale. It should be appreciated that these drawings merely depict some embodiments according to the present disclosure, and should not be regarded as limiting the scope of the present disclosure. The drawings are intended to facilitate understanding of the present disclosure, and do not constitute a limitation to the present disclosure. In the drawings.

Figure 1:
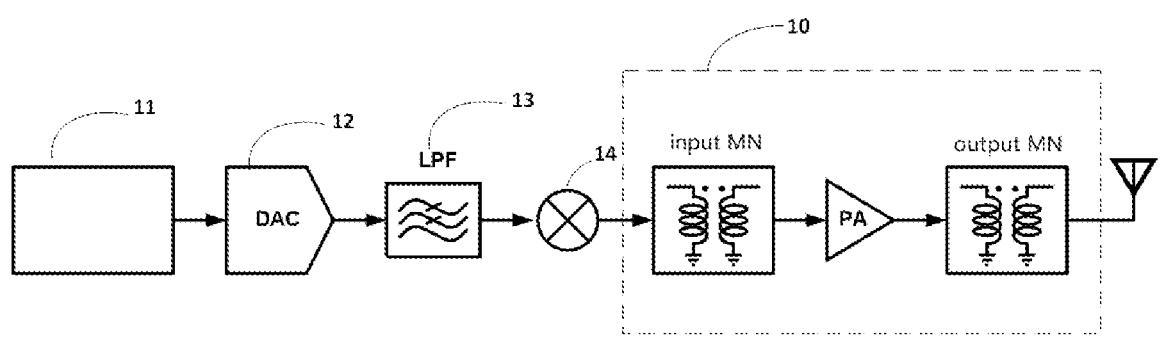
FIG. 1 is a schematic structural diagram of a transmitter in the prior art.

| List of reference characters | |
|---|---|
| 10 Broadband power amplifier device | |
| 11 Digital baseband unit | 12 Digital-to-analog converter |
| 13 Low-pass filter | 14 Mixer |
| 100 Input matching network | |
| 110 First inductor | 111 First end 112 Second end |
| 120 Second inductor | 121 First end 122 Second end |
| 130 Third inductor | 131 First end 132 Second end |
| 140 Driving amplifier | |
| 150 First frequency modulator | |
| 160 Second frequency modulator | |
| 170 Third frequency modulator | |
| 200 Power amplifier | |
| 300 Output matching network | |

DETAILED DESCRIPTION

Only certain exemplary embodiments are described hereinafter. As will be appreciated by those skilled in the art, the described embodiments may be modified in various different ways without departing from the spirit or scope of the present disclosure. Therefore, the drawings and description are to be regarded as illustrative in nature rather than restrictive.

In the description of the present disclosure, it should be understood that, orientation or position relationships indicated by the terms "center", "longitudinal", "transversal", "length", "width", "thickness", "upper", "lower", "front", "rear", "left", "right", "vertical", "horizontal", "top", "bottom", "inner", "outer", "clockwise", "counterclockwise", "axial", "radial", "circumferential", or the like are based on the orientation or position relationships as shown in the drawings, which are merely for the sake of convenient and simplified description of the present disclosure rather than indicating or implying that the involved device or element necessarily has a particular orientation or is constructed and operates in a particular orientation. Therefore, these terms should not be understood as a limitation to the present disclosure.

In addition, the terms such as "first" and "second" are merely for a descriptive purpose, and cannot be understood as indicating or implying a relative importance, or implicitly indicating the number of the involved technical features. Hence, the features defined with "first" and "second" can explicitly or implicitly include one or more features. In the description of the present disclosure, "a plurality of" refers to two or more in number, unless otherwise specifically defined.

In the present disclosure, unless otherwise specified and defined, the terms "installed", "connected" and "fixed" should be comprehended in a broad sense. For example, these terms may refer to a fixed or detachable connection or being integrated; a mechanical, electrical or communication connection; a direct connection or an indirect connection via an intermediate medium; or a communication between interiors of two elements or an interaction between two elements. The specific meanings of the foregoing terms in the present disclosure may be understood by those skilled in the art according to specific context.

In the present disclosure, unless otherwise specified and defined, the expression that a first feature is "above" or "below" a second feature may include a meaning that the first and second features are in direct contact with each other, and may further include a meaning that the first and second features are not in direct contact with each other with an additional feature placed therebetween. Moreover, the expression that the first feature is "on", "over" or "above" the second feature may include a meaning that the first feature is right above or obliquely above the second feature, or simply means that the first feature is higher in level than the second feature. Likewise, the expression that the first feature is "under", "below" or "beneath" the second feature may include a meaning that the first feature is right below or obliquely below the second feature, or simply means that the first feature is lower in level than the second feature.

The following disclosure provides many various embodiments or examples for implementation of various structures of the present disclosure. In order to simplify the disclosure of the present disclosure, the components and configurations of specific examples are described hereinafter. Of course, they are merely illustrative and are not intended to limit the present disclosure. In addition, the same reference numerals and/or characters may be used throughout different examples in the present disclosure for the sake of simplification and clarity, but do not necessarily indicate any relationship between the various embodiments and/or examples.

As shown in FIG. 1, the conventional transmitter chain for transmitting radio frequency signals includes a digital baseband unit 11, a digital-to-analog converter 12, a low-pass filter 13, a mixer 14, a broadband power amplifier device 10 and an antenna which are connected in sequence. The broadband power amplifier device 10 includes an input matching network, a power amplifier, and an output matching network. An output terminal of the broadband power amplifier device 10 is connected to the antenna. Conventionally, the input matching network and the output matching network are each composed of shunt inductors and provide a gain only in a range of resonance frequencies. In addition, the shunt inductor loses the signal gain at low frequencies and limits the operable RF range of the transmitter to be no more than 20% centered with the RF frequency, for example, a conventional 2.4 GHz transmitter can work at 2.4 GHz+/−240 MHz only.

Figure 2:
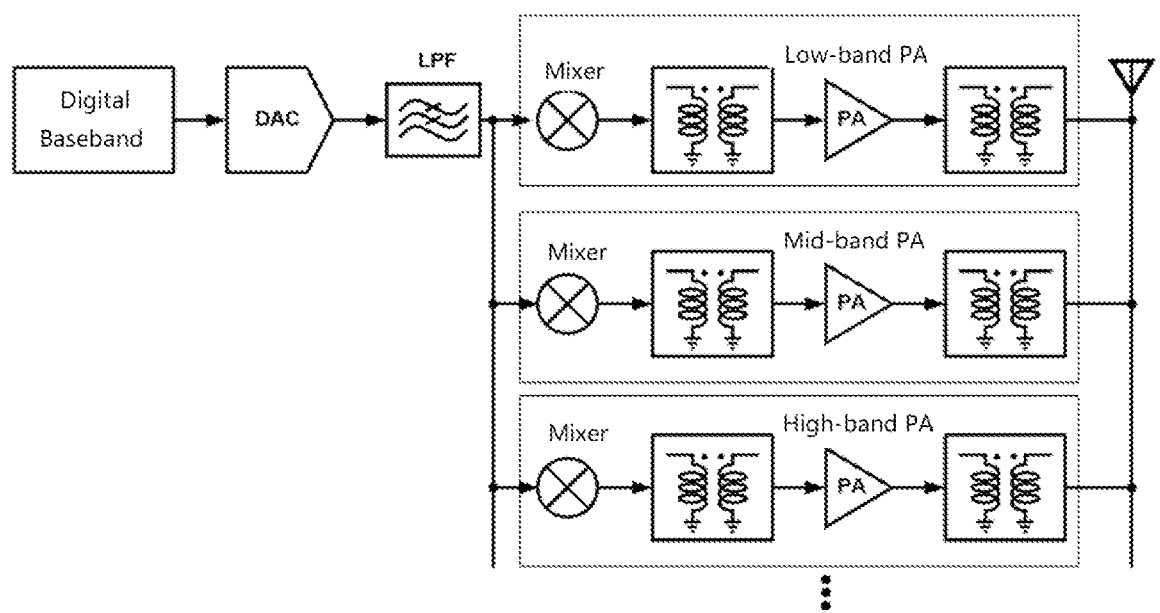
FIG. 2 is a schematic structural diagram of another transmitter structure in the prior art.
Figure 3:
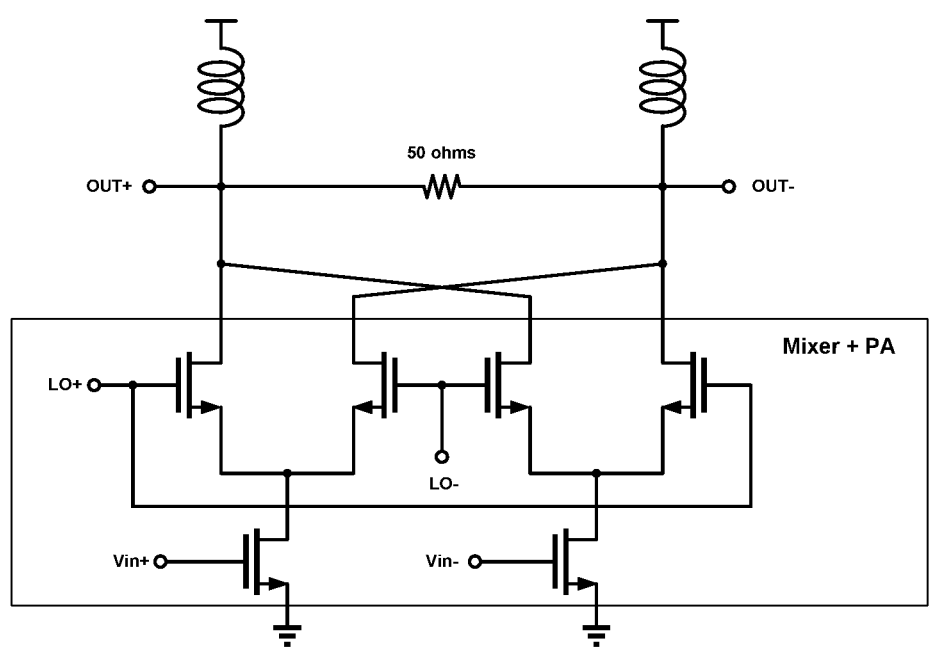
FIG. 3 is a schematic structural diagram of yet another transmitter structure in the prior art.

In order to extend the RF ranges of conventional transmitters, a first type of existing broadband amplifier as shown in FIG. 2 has a plurality of power amplifiers operable at different bands (high-band, mid-band and low-band) connected in parallel, which means that a plurality of mixers, Pas, and input and output matching networks are required to extend the RF range. However, in this structure, the occupied area is proportional to the frequency band, which leads to an increase in the hardware area of the transmitter and thereby causes a rather high power consumption. A second type of existing broadband amplifier is formed by replacing the portions of the mixer, the input MN, the PA, and the output MN as shown in FIG. 1 with an active mixer. The structure of the active mixer is shown in FIG. 3. In FIG. 3, instead of forming a resonance, the top two inductors take very large values to achieve DC short circuit and AC open circuit, which thereby is not a narrow bandwidth design. This architecture can achieve operable RF ranging from a low frequency to a high frequency, because there is no resonance structure of inductance and capacitance in parallel in the internal structure. However, the whole size of the four NMOSs connected respectively to LO+/− in order to output high power shall be rather large, such that the circuit for driving the NMOS gates requires considerable current consumption. In addition, such current consumption is proportional to the frequency, and thus the higher the frequency, the more the current consumption. Furthermore, the current efficiency of the active mixer per se is worse than that of a general amplifier, which is a reason why the second type of broadband amplifier is so power-consuming. Therefore, although the active mixer can achieve power amplification as well as a radio frequency range that is tunable starting from 0 Hz, it would cause rather high current consumption, and the resulting mixing gain may cause rather poor power efficiency.

Figure 4:
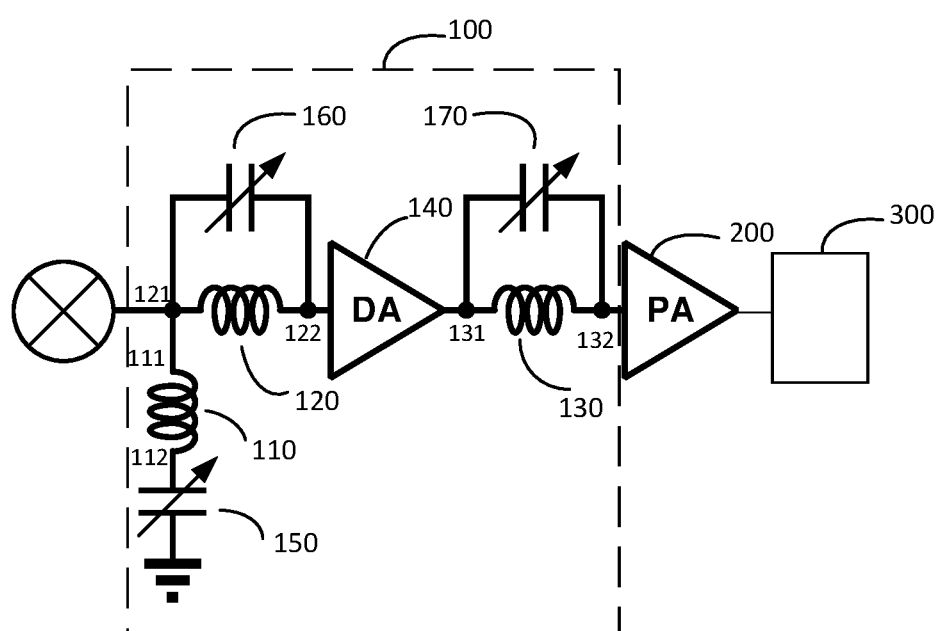
FIG. 4 is a schematic structural diagram of a broadband power amplifier device according to an embodiment of the present disclosure.

Embodiments of the present disclosure provide a novel broadband power amplifier device to replace the existing broadband power amplifier device 10 in the prior art. As shown in FIG. 4, the novel broadband power amplifier device includes an input matching network 100, a power amplifier 200, and an output matching network 300 connected in sequence. The input matching network 100 includes a first inductor 110, a second inductor 120, a third inductor 130, a driver amplifier 140, a first frequency modulator 150, a second frequency modulator 160, and a third frequency modulator 170.

The first inductor 110 has a first end 111 connected to the mixer 14 and a second end 112 connected to one end of the first frequency modulator 150, with the other end of the first frequency modulator 150 being grounded. The second inductor 120 has a first end 121 connected to the first end 111 of the first inductor 110 and a second end 122 connected to an input terminal of the driver amplifier 140, with the second frequency modulator 160 being connected across the second inductor 120. The third inductor 130 has a first end 131 connected to an output terminal of the driver amplifier 140 and a second end 132 connected to an input terminal of the power amplifier 200, with the third frequency modulator 170 being connected across the third inductor 130.

In the first type of existing transmitter, the mixer takes part in signal amplification and a large DC current flows therethrough. In order to ensure linearity, the mixer is designed to have a rather large size, and a large LO driver is required to drive this large-size mixer.

In the second type of existing transmitter, the active mixer also functions as a power amplifier and a large DC current flows therethrough, and thus the active mixer is disadvantageous in that it contains an extra layer of transistors to complete the mixing function compared with normal power amplifiers, thus lacking head space compared with passive mixers, which causes the linearity of the active mixer to be degraded and the internal resistance of the active mixer to be increased, resulting in the decreased power efficiency due to the power dispassion in the internal resistance. In order to overcome those shortcomings (such as degraded linearity and decreased power efficiency), each layer of transistors needs to be increased in size, which, however, causes increased power consumption by the LO driver of the active mixer.

Considering that the bandwidth of the power amplifier is mainly limited by the parasitic capacitance caused by the transistors, the broadband power amplifier device according to embodiments of the present disclosure is improved in that the effect of the parasitic capacitance can be cancelled through resonation by adding inductors, such as the first inductor 110, the second inductor 120, and the third inductor 130, and thus the operatable radio frequency range of the power amplifier can begin from 0 Hz to extend the bandwidth. Moreover, the first inductor 110, the second inductor 120, and the third inductor 130 are connected in series in a single path to reduce the inductor area compared with the structure of first type of existing transmitter in the prior art in which a plurality of power amplifiers with different bands (i.e. high-band, mid-band and low-band) are connected in parallel. It shall be noted that the extended bandwidth can be achieved even with only the second inductor 120 and the third inductor 130.

In certain embodiments, the first frequency modulator 150, the second frequency modulator 160, and the third frequency modulator 170 may be configured to filter out the third harmonic wave. In order for tuning based on different signal frequencies, the first inductor 110 and the first frequency modulator 150 may form a notch filter, the second inductor 120 and the second frequency modulator 160 may form a band pass filter, the third inductor 130 and the third frequency modulator 170 may form another band pass filter, and all of these three filters may be tuned to three times of the signal frequency to filter out the third harmonic wave generated by the amplifier.

The driver amplifier 140 is configured to provide for a gain of the voltage from the input matching network, and the power amplifier 200 and the mixer maintain their own functions. Compared with the active mixer which plays a dual role of mixing and power amplification in the structure of the second type of existing transmitter in the prior art, the broadband power amplifier device according to embodiments of the present disclosure has much better power efficiency and the greatly improved power without a large LO driver.

In embodiments of the present disclosure, with the introduction of the plurality of inductors in series into the broadband power amplifier device, the effect of parasitic capacitance can be cancelled through resonation, and the operatable radio frequency range of the power amplifier can begin from 0 Hz, which can effectively extend the bandwidth, while reducing the area of the power amplifier and current consumption and increasing the power greatly without a large LO driver.

In certain embodiments, each of the first frequency modulator, the second frequency modulator and the third frequency modulator may have a frequency modulation range from 5 GHz to 15 GHz.

In an example, the frequency modulation range of the frequency modulator may start from 0, which effectively expands the tunable range of frequency band.

In certain embodiments, the first frequency modulator, the second frequency modulator and the third frequency modulator may be tunable capacitors.

In an example, the first frequency modulator, the second frequency modulator, and the third frequency modulator may be tunable capacitors or other tunable devices, all of which fall within the protection scope of embodiments of the present disclosure.

In certain embodiments, the tunable frequency range of the first inductor, the second inductor, and the third inductor may be designed according to actual conditions, so that the filters formed thereof may have a wider frequency range.

In certain embodiments, the broadband power amplifier device may be operable at a radio frequency range greater than 6 GHz.

In those embodiments, the radio frequency range of the broadband power amplifier device, which is greater than 6 GHz, is 10 times greater than that of the conventional transmitter which is 600 MHz.

Embodiments of the present disclosure further provides a transmitter including the aforesaid broadband power amplifier device. In certain embodiments, the transmitter may further include the mixer. The effect of parasitic capacitance can be cancelled through resonation, and thus the tunable radio frequency can range from 0, which can effectively extend the bandwidth of the transmitter, while reducing the area of the transmitter and increasing the power greatly without a large LO driver.

The aforesaid embodiments do not constitute a limitation on the protection scope of the present disclosure. Those skilled in the art shall understand that various modifications, combinations, sub-combinations and substitutions may be made according to design requirements and other factors. The modification, equivalent replacement, improvement, or the like made according to the spirit and principle of the present disclosure shall be regarded as within the protection scope of the present disclosure.

What is claimed is:

1. A broadband power amplifier device, applicable to a transmitter and having an input terminal connected to a mixer and an output terminal connected to an antenna, the broadband power amplifier device comprising an input matching network, a power amplifier, and an output matching network connected in sequence, wherein the input matching network comprises a first inductor, a second inductor, a third inductor, a driver amplifier, a first frequency modulator, a second frequency modulator, and a third frequency modulator;

the first inductor having a first end connected to an output terminal of the mixer and a second end connected to one end of the first frequency modulator, with the other end of the first frequency modulator being grounded;

the second inductor having a first end connected to the first end of the first inductor and a second end connected to an input terminal of the driver amplifier, with the second frequency modulator being connected across the second inductor; and the third inductor having a first end connected to an output terminal of the driver amplifier and a second end connected to an input terminal of the power amplifier, with the third frequency modulator being connected across the third inductor.

2. The power amplifier device according to claim 1, wherein each of the first frequency modulator, the second frequency modulator and the third frequency modulator is a tunable capacitor.

3. The power amplifier device according to claim 1, wherein the broadband power amplifier device is operable in a radio frequency range greater than 6 GHz.

4. A transmitter comprising a broadband power amplifier device according to claim 1.

* * * * *